United States Patent
Lim

(10) Patent No.: US 8,729,926 B2
(45) Date of Patent: May 20, 2014

(54) OUTPUT SIGNAL CIRCUIT FOR USE IN A RECEIVER

(75) Inventor: Mei Lian Lim, Kanagawa-ken (MY)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 13/422,362

(22) Filed: Mar. 16, 2012

(65) Prior Publication Data

US 2013/0063204 A1　Mar. 14, 2013

(30) Foreign Application Priority Data

Sep. 14, 2011　(JP) ................. 2011-200510

(51) Int. Cl.
　　*H03K 3/00*　　(2006.01)

(52) U.S. Cl.
　　USPC ............. 327/108; 327/427; 327/434

(58) Field of Classification Search
　　USPC .......................... 327/108, 427, 434
　　See application file for complete search history.

(56) References Cited

U.S. PATENT DOCUMENTS

| | | | | |
|---|---|---|---|---|
| 5,559,464 | A * | 9/1996 | Orii et al. | 327/333 |
| 6,831,483 | B2 * | 12/2004 | Shimazaki et al. | 326/121 |
| 7,525,077 | B2 * | 4/2009 | Kim et al. | 250/208.1 |
| 8,269,854 | B2 * | 9/2012 | Jung et al. | 348/229.1 |
| 2004/0217398 | A1 * | 11/2004 | Lee | 257/292 |
| 2005/0001246 | A1 * | 1/2005 | Mouli | 257/291 |
| 2006/0175538 | A1 * | 8/2006 | Kim et al. | 250/208.1 |
| 2006/0208285 | A1 * | 9/2006 | Inoue et al. | 257/239 |
| 2006/0261431 | A1 * | 11/2006 | Kim et al. | 257/462 |
| 2006/0284653 | A1 * | 12/2006 | Chen | 327/95 |
| 2009/0160971 | A1 * | 6/2009 | Jung et al. | 348/229.1 |
| 2012/0313693 | A1 * | 12/2012 | Do et al. | 327/535 |

FOREIGN PATENT DOCUMENTS

| | | |
|---|---|---|
| JP | 09-246942 | 9/1997 |
| JP | 2002-124834 | 4/2002 |
| JP | 2003-133861 | 5/2003 |
| JP | 2004-165911 | 6/2004 |
| JP | 2009-033637 | 2/2009 |

OTHER PUBLICATIONS

Office Action dated Feb. 12, 2014, in Japanese Patent Application No. 2011-200510 (with English translation).

* cited by examiner

*Primary Examiner* — Ryan Jager
(74) *Attorney, Agent, or Firm* — Oblon, Spivak, McClelland, Maier & Neustadt, L.L.P.

(57) ABSTRACT

According to one embodiment, an output signal circuit for use in a receiver is provided. The output signal circuit is provided with first and second transistors of an insulated gate field effect type, and a backgate bias generator. A source of the first transistor is capable of receiving an input signal. A source of the second transistor is capable of generating an output signal. A backgate bias generator produces a backgate bias voltage which is applied to backgate of the first and second transistors commonly.

3 Claims, 5 Drawing Sheets

OUTPUT SIGNAL CIRCUIT FOR USE IN A RECEIVER

CROSS-REFERENCE TO RELATED APPLICATION

This application is based upon and claims the benefit of priority from the prior Japanese Patent Application No. 2011-200510, filed on Sep. 14, 2011, the entire contents of which are incorporated herein by reference.

FIELD

Embodiments described herein relate generally to an output signal circuit for use in a receiver.

A radio communication receiver uses a mixer circuit which generates an intermediate frequency signal (IF signal) by mixing a radio frequency received signal (RF signal) and a local oscillator signal (LO signal). A circuit called a Gilbert cell is well-known as a mixer circuit using MOS transistor.

In order to output the IF signal which generated from such a mixer circuit to the external output, an output signal circuit is connected to a subsequent stage of the mixer circuit. In a case where a load connected to a subsequent stage of the output signal circuit needs to be driven at low impedance, a source follower circuit with low output impedance is used for the output stage of the output signal circuit.

In such a case that the source follower circuit is used for the output stage, a common gate MOS transistor where the gate is applied to a constant voltage may be connected to a previous stage of the source follower circuit. An input signal is applied to a source of the common gate transistor. A drain of the MOS transistor is connected to a gate of the MOS transistor which is configured in the above source follower circuit.

In such a case where an output signal circuit is composed of N-channel MOS transistors, a backgate of the common gate MOS transistor and a backgate of the MOS transistor configured in the source follower circuit are connected to a ground potential (GND) terminal. Therefore, the threshold voltages Vth of the respective MOS transistors are high.

When the threshold voltage Vth of the common gate transistor is high, the signal level range of the input signal which brings the common gate transistor into conduction becomes narrow. Consequently, the dynamic range of an output signal which is output from the source follower circuit becomes smaller.

In order to avoid the above problem, it is sufficient to lower the threshold voltage Vth of the common gate transistor. One of the techniques for lowering the threshold voltage is to increase the size of the transistor. However, the increasing of the size of the transistor increases the parasitic capacitance inevitably so that the operating speed of the transistor is degraded. As a result, frequency characteristics of an output signal which is output from the output signal circuit may be deteriorated.

DETAILED DESCRIPTION

Figure 1:
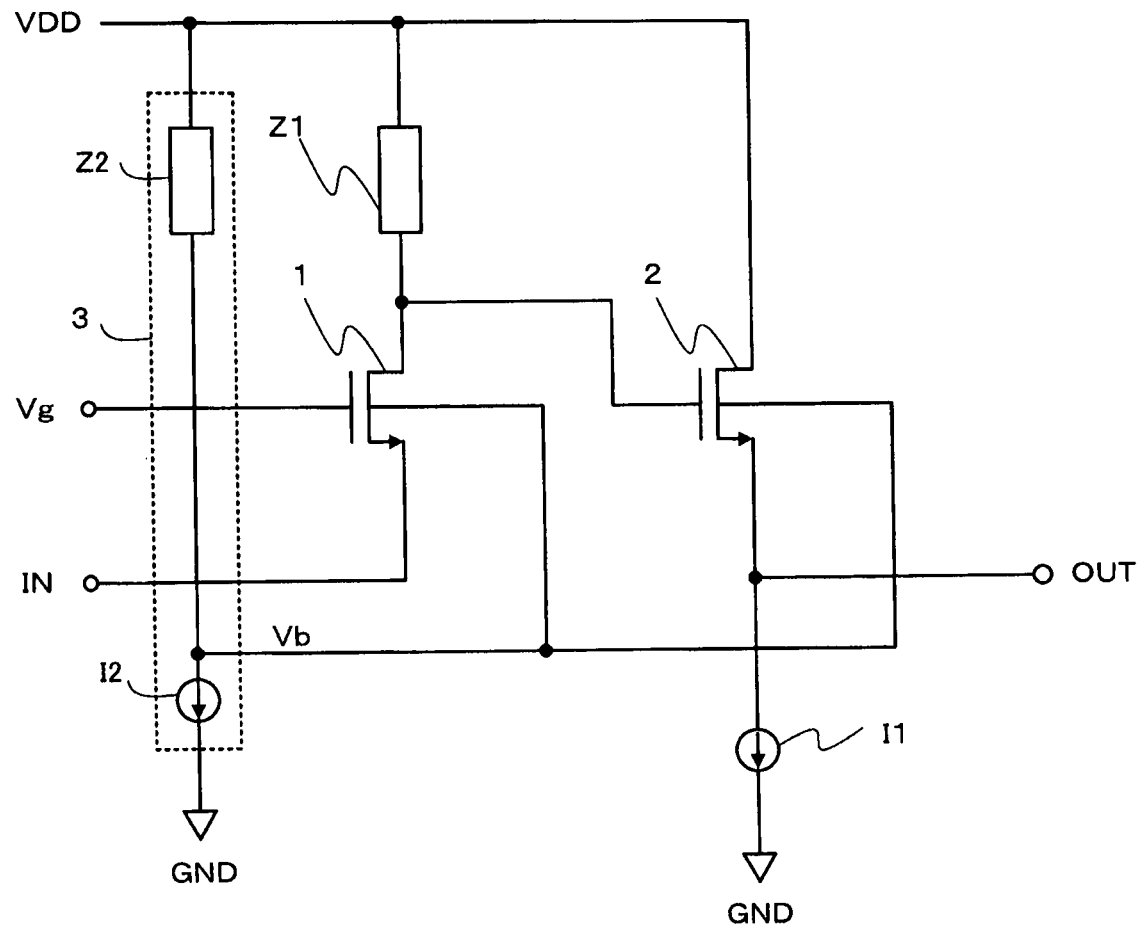
FIG. 1 is a circuit diagram showing an output signal circuit according to first embodiment.

According to an embodiment, an output signal circuit for use in a receiver is provided. The output signal circuit is provided with first and second transistors of an insulated gate field effect type, and a backgate bias generator. A source of the first transistor is capable of receiving an input signal. A source of the second transistor is capable of generating an output signal. A backgate bias generator produces a backgate bias voltage which is applying to backgate of the first and second transistor commonly.

Hereinafter, further embodiments will be described with reference of the drawings.

In the drawings, the same reference numerals denote the same or similar portions respectively.

A first embodiment will be described with reference to FIG. 1.

FIG. 1 is a circuit diagram showing an output signal circuit according to first embodiment.

The output signal circuit of this embodiment is provided with N-channel MOS transistors 1 and 2, and a backgate bias generator 3. A constant gate voltage Vg is applied to a gate of the transistor 1, and an input signal IN is applied to a source of the transistor 1. A gate of the transistor 2 is connected to a drain of the transistor 1. A source of the transistor 2 is connected to a grounding line GND through a current source I1, and grounded. An output signal OUT is outputted from the source of the transistor 2. The backgate bias generator 3 produces a backgate bias voltage Vb to be applied to backgates of the transistors 1 and 2 commonly. The backgate bias generator 3 provides a constant backgate bias voltage or an adjustable backgate bias voltage. The backgate bias generator 3 is provided with a load Z2 and a current source I2. One end of the load Z2 is connected with a power supply voltage line VDD, and the other end of the load Z2 is connected with one end of the current source I2. The other end of the current source I2 is connected with the grounding line GND.

A load Z1 is connected between the drain of the transistor 1 and the power supply voltage line VDD. A drain of the transistor 2 is connected to the power supply voltage line VDD, and the source of the transistor 2 is connected to the current source I1.

In this embodiment, the backgate bias voltage Vb is commonly applied to the transistors 1 and 2.

The higher the backgate bias voltage Vb is, the lower the threshold voltages of the transistors 1 and 2 are. A change ΔVth of the threshold voltages is expressed as follows. "γ" represents a substrate bias effect coefficient, and "$\phi_F$" represents a Fermi potential.

$$\Delta Vth = \gamma(\sqrt{(2\phi_F - Vb)} - \sqrt{(2\phi_F)})$$

In each of the transistors 1 and 2, a parasitic diode is formed between a semiconductor substrate and the source or between the semiconductor substrate and the drain. When the backgate bias voltage Vb is not less than a forward voltage of the parasitic diode, a forward bias is applied to the parasitic diode, which causes a current to flow through the parasitic diode.

In order to prevent the above situation, in the embodiment, the backgate bias voltage Vb is set as high as possible so that the forward bias is not applied to the parasitic diode in each of the transistors 1 and 2. Setting of the backgate bias voltage Vb will be described with reference of FIG. 2.

Figure 2:
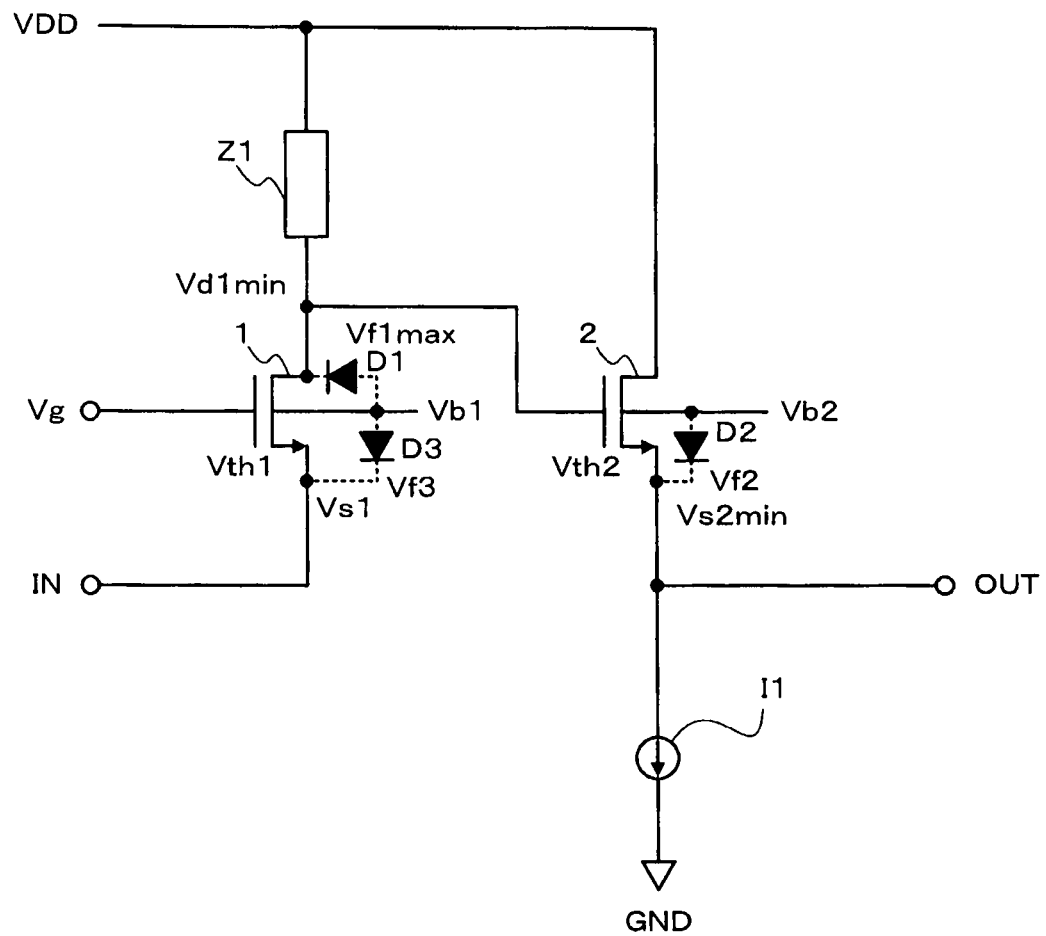
FIG. 2 is a circuit diagram explaining the setting of backgate bias voltage in the output signal circuit according to the first embodiment.

FIG. 2 shows a parasitic diode D1 formed between the semiconductor substrate and the drain of the transistor 1, a parasitic diode D2 formed between the semiconductor substrate and the source of the transistor 2, and a parasitic diode D3 formed between the semiconductor substrate and the source of the transistor 1, which is produced in the circuit shown in FIG. 1 respectively. For convenience of explanation, the backgate bias voltage of the transistor 1 is represented by Vb1, and the backgate bias voltage of the transistor 2 is represented by Vb2.

Assuming the minimum voltage of the drain of the transistor 1 is Vd1min and a forward voltage of the parasitic diode D1 is Vf1max, the backgate bias voltage Vb1 of the transistor 1 needs to be set as follows so as not to turn on the parasitic diode D1.

$$Vb1=Vd1min-Vf1max \quad (1)$$

Assuming the drain voltage of the transistor 1 is Vd1min and the threshold voltage of the transistor 2 is represented by Vth2, the source voltage Vs2min of the transistor 2 is expressed as follows.

$$Vs2min=Vd1min-Vth2 \quad (2)$$

Furthermore, the substrate-source voltage Vf2 of the transistor 2 is expressed as follows.

$$Vf2=Vb2-Vs2min \quad (3)$$

Substitute Expression (2) into Expression (3) becomes, $$Vf2=Vb2-Vd1min+Vth2 \quad (4)$$

The following is obtained by substituting Expression (2) into Expression (3). In this embodiment, since Vb2=Vb1 (=Vb), the substrate-source voltage Vf2 of the transistor 2 is expressed as follows when Expression (1) is substituted into Expression (4).

$$\begin{aligned} Vf2 &= Vd1min - Vf1max - Vd1min + Vth2 \\ &= Vth2 - Vf1max \end{aligned} \quad (5)$$

When the threshold voltage Vth2 of the transistor 2 is set approximately equal to the forward voltage Vf1max of the parasitic diode D1 by adjusting the impurity concentration, for example, the threshold voltage Vth2 is expressed as follows.

$$Vth2 \approx Vf1max \quad (6)$$

From Expression (5), the substrate-source voltage Vf2 of the transistor 2 is expressed as follows.

$$Vf2 \approx 0 \quad (7)$$

Generally, when the MOS transistor semiconductor substrate is a silicon (Si) substrate, the forward voltage of the parasitic diode is about 0.7 V. Thus, when Vf2≈0, the parasitic diode D2 is not be turned on.

Figure 3:
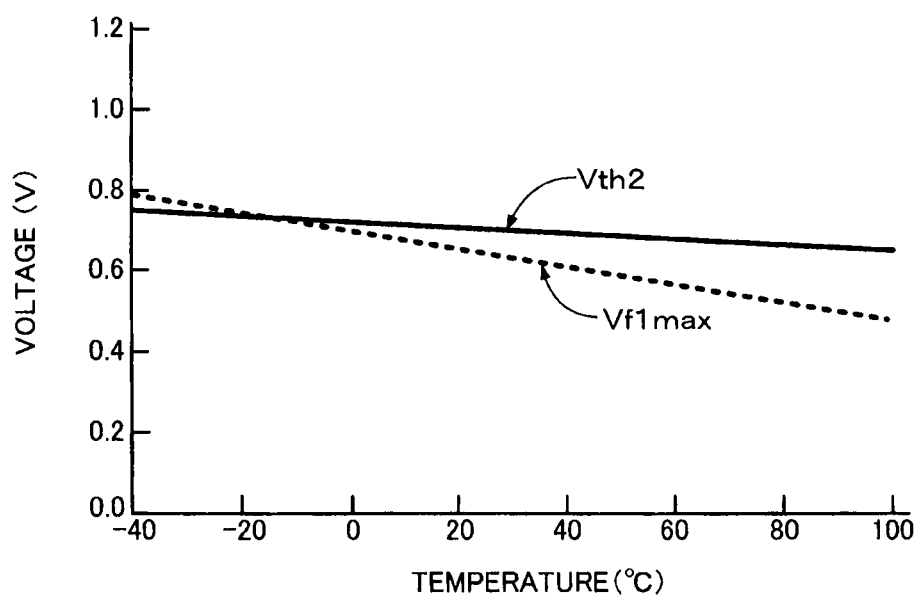
FIG. 3 is a circuit diagram showing an example of a simulation result of temperature characteristics of a threshold voltage of a MOS transistor and a forward voltage of a parasitic diode in regard of the output signal circuit according to the first embodiment.

FIG. 3 shows a simulation result of temperature characteristics of the threshold voltage Vth2 of the transistor 2 and the forward voltage Vf1max of the parasitic diode D1, under the above settings.

As shown in FIG. 3, even when the temperature rises up to about 100° C., (Vth2−Vf1max)<0.2 V. Thus, the parasitic diode D2 is not be turned on under a normal operation temperature range.

Setting of a gate voltage Vg to be applied to the gate of the transistor 1 will be described.

In order not turning on the parasitic diode D3 between the semiconductor substrate and source of the transistor 1, for the minimum case, the source voltage Vs1 of the transistor 1 needs to be set as follows, $$Vs1 \approx Vb1 \quad (8)$$

When the threshold voltage of the transistor 1 is Vth1, the source voltage Vs1 of the transistor 1 is expressed as follows.

$$Vs1=Vg-Vth1 \quad (9)$$

Thus, the gate voltage Vg is expressed as follows.

$$Vg=Vs1+Vth1 \quad (10)$$

The gate voltage Vg is expressed as follows when substituting Expression (8) into Expression (10).

$$Vg \approx Vb1+Vth1 \quad (11)$$

In the embodiment, Vb1=Vb2=Vb can be established by setting the threshold voltage Vth2 of the transistor 2 so as to satisfy Expression (6). Accordingly, Expression (11) is expressed as follows.

$$Vg \approx Vb+Vth1 \quad (12)$$

When the gate voltage Vg to be applied to the gate of the transistor 1 is set accordingly to Expression (12), the parasitic diode D3 between the semiconductor substrate and the source of the transistor 1 can be prevented from being turned on.

As described above, according to this embodiment, the backgate bias voltage Vb can be increased within a range in which the parasitic diode is not turned on. Thus, the threshold voltages of the transistors 1 and 2 can be lowered, and the dynamic range of the output signal can be increased. Furthermore, since the threshold voltage can be reduced without increasing the sizes of the transistors 1 and 2, good frequency characteristics can be obtained. Even if an ambient temperature changes, the dynamic range and the frequency characteristics can be maintained.

Figure 4:
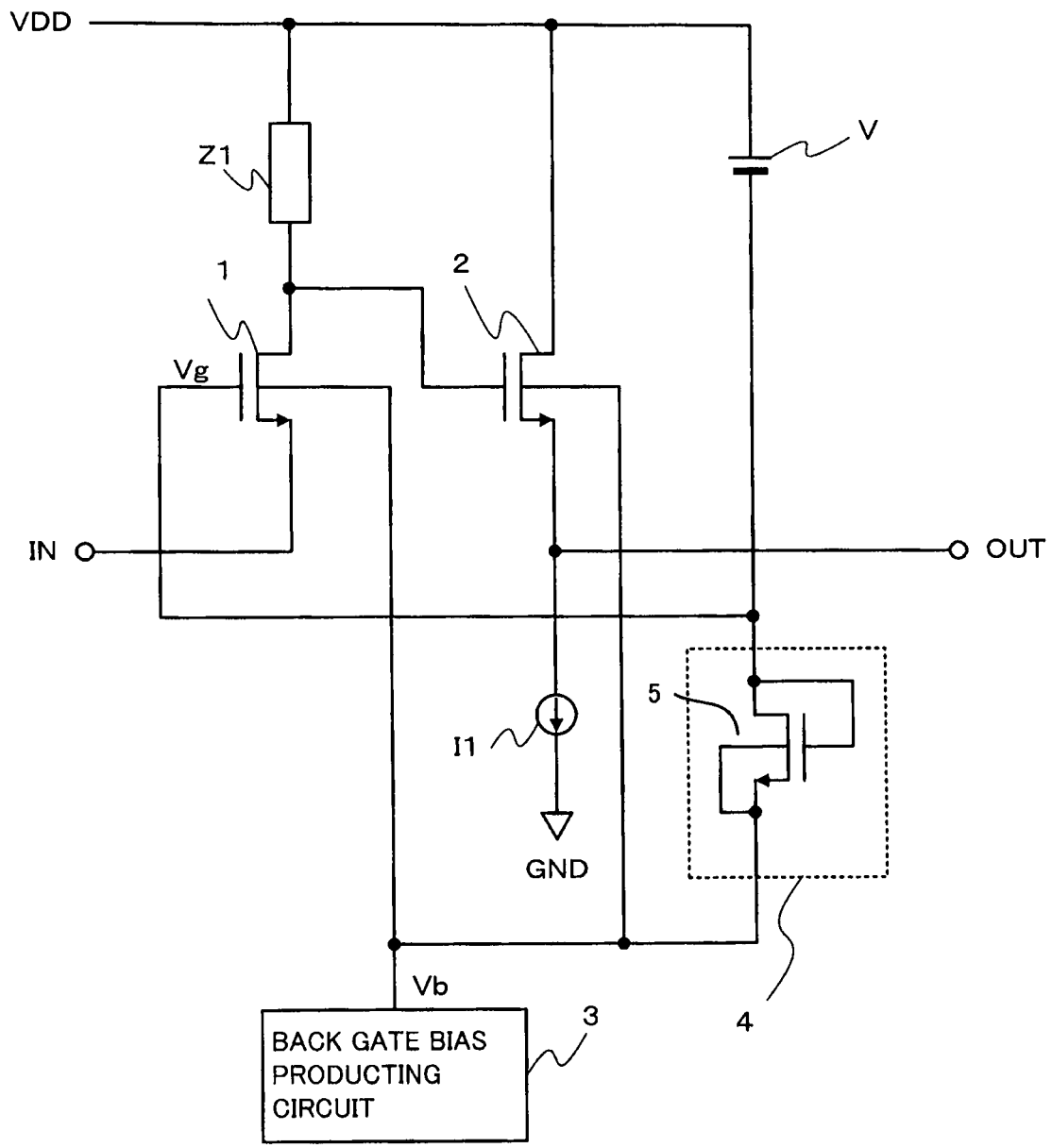
FIG. 4 is a circuit diagram showing an output signal circuit according to second embodiment.

FIG. 4 is a circuit diagram showing an output signal circuit according to second embodiment.

The output signal circuit of the embodiment is a circuit which is obtained by adding a gate voltage generator 4 to the output signal circuit of the first embodiment. Specifically, the gate voltage generator 4 generates a gate voltage Vg to be applied to a gate of an N-channel MOS transistor 1.

The gate voltage generator 4 has an N-channel MOS transistor 5 having the same electrical characteristics as those of the transistor 1. Accordingly, a threshold voltage of the transistor 5 has the same value as a threshold voltage Vth1 of the transistor 1. Even if the threshold voltage Vth1 of the transistor 1 fluctuates due to production variation or change in operating environment, the threshold voltage Vth1 of the transistor 5 also fluctuates accordingly.

A load Z1 is connected between a drain of the transistor 1 and a power supply voltage line VDD. A source of a transistor 2 is grounded through a current source I1. A gate of the transistor 5 is connected to a drain of the transistor 5. The drain of the transistor 5 is connected to a gate of the transistor 1. A direct-current power supply V is connected between the drain of the transistor 5 and the power supply voltage line VDD. A backgate bias voltage Vb is applied from the backgate bias generator 3 to a source and a backgate of the transistor 5.

A voltage which is outputted from the drain of the transistor 5 when an input signal IN is inputted to a source of the transistor 1, is a gate voltage Vg expressed by Expression (12). The voltage is obtained by adding the threshold voltage Vth1 of the transistor 1 to the backgate bias voltage Vb.

According to the embodiment described above, even if the threshold voltage Vth1 of the transistor 1 fluctuates, the gate voltage Vg of the transistor 1 corresponding to the fluctuation will be automatically generated inside the gate voltage generator 4.

Figure 5:
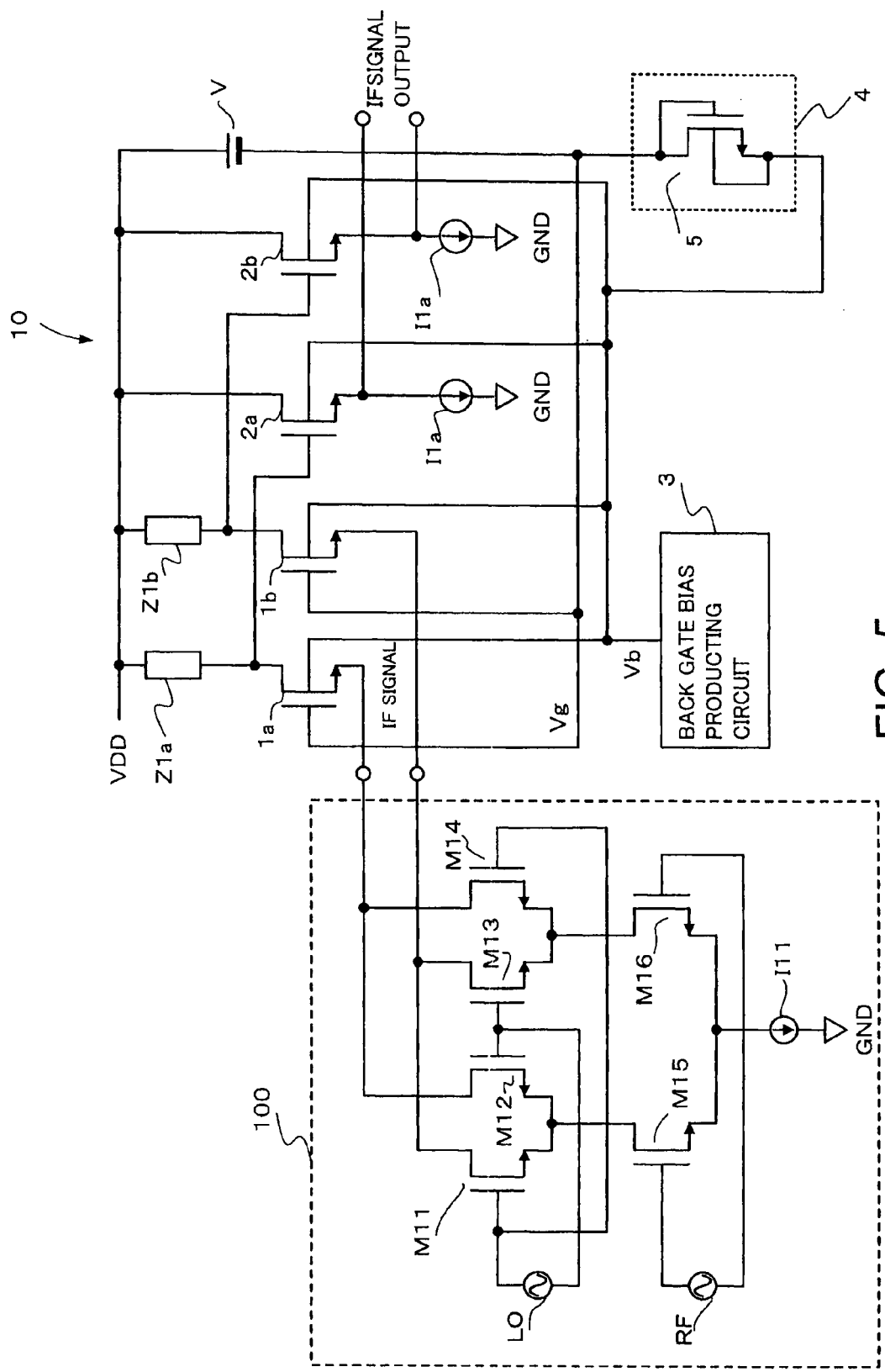
FIG. 5 is a circuit diagram showing an output signal circuit according to third embodiment.

FIG. 5 is a circuit diagram showing an output signal circuit according to third embodiment. This embodiment shows an application of the output signal circuit according to the second embodiment. Specifically, FIG. 5 shows an example where intermediate frequency signals (IF signals) generated from a mixer circuit 100 are applied to output signal circuit 10 of the embodiment.

The mixer circuit 100 is well known Gilbert cell. A local oscillator signal (LO signal) is input from an oscillator circuit LO to each of a differential pair including N-channel MOS transistors M11, M12 and a differential pair including N-channel MOS transistors M13, M14. A radio frequency received signal (RF signal) is input from an oscillator circuit RF to a differential pair including N-channel MOS transistors M15, M16.

Specifically, one end of the oscillator circuit LO is connected to gates of the transistors M11, M14, and the other end of the oscillator circuit LO is connected to gates of the transistors M12, M13. One end of the oscillator circuit RF is connected to a gate of the transistor M15, and the other end of the oscillator circuit RF is connected to a gate of the transistor M16. Sources of the transistors M11 and M12 are commonly connected to a source of the transistor M15. Sources of the transistors M13, M14 are commonly connected to a source of the transistor M16. The sources of the transistors M15, M16 are connected to a grounding line through a current source I11, and are grounded. The mixer circuit 100 multiplies the RF signal from the oscillator circuit RF by the LO signal from the oscillator circuit LO, and generates two intermediate frequency signals (IF signals) from drains of the transistors M11, M13 and transistors M12, M14.

The IF output signals from the mixer circuit 100 are input to the output signal circuit 10. Since the IF signals are differential signals, the output signal circuit 10 includes four N-channel MOS transistors 1a, 1b, 2a and 2b. In other words, the output signal circuit 10 has two sets of pairs, each of which includes the transistors 1, 2 shown in the output signal circuit of the second embodiment.

Furthermore, the signal output circuit 10 includes a backgate bias generator 3 and a gate voltage generator 4 described above. One of the two IF signals which differential output is input to a source of the transistor 1a. The other of the IF signals which differential output is input to a source of the transistor 1b. A load Z1a is connected between the power supply voltage line VDD and the drain of the transistor 1a and the gate of the transistor 2a. A load Z1b connected between the power supply voltage line VDD, and the drain of the transistor 1b and the gate of the transistor 2b.

Sources of the MOS transistors 2a, 2b are grounded through current sources I1a and I1b, respectively. A direct-current power supply V is connected between the power supply voltage line VDD and a drain of a transistor 5 provided in the gate voltage generator 4. The semiconductor substrate constituting the transistors 1a, 1b, 2a and 2b is connected to the backgate bias generator 3.

The backgate bias generator 3 applies a common backgate bias voltage Vb to the transistors 1a, 1b, 2a and 2b.

The gate voltage generator 4 applies a gate voltage Vg to the transistors 1a, 1b.

The IF output signals which differential outputs are outputted from sources of the transistors 2a, 2b.

According to the embodiment described above, the IF signals outputted from the mixer circuit 100 can produce a wide dynamic range and good frequency characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An output signal circuit for use in a receiver, comprising:
   first and second transistors of an insulated gate field effect type, a source of the first transistor being capable of receiving an input signal, a source of the second transistor being capable of generating an output signal;
   a backgate bias generator to produce a backgate bias voltage which is applied to backgates of the first and second transistors commonly; and
   a gate voltage generator including a third transistor of an insulated gate field effect type, a gate and a drain of the third transistor being connected to a gate of the first transistor and a voltage source, a source of the third transistor being connected to the backgate bias generator to receive supply of the backgate bias voltage.

2. An output signal circuit for use in a receiver, comprising:
   first and second transistors of an insulated gate field effect type, a source of the first transistor being capable of receiving an input signal, a source of the second transistor being capable of generating an output signal;
   a backgate bias generator to produce a backgate bias voltage which is applied to backgates of the first and second transistors commonly; and
   a gate voltage generator including a third transistor of an insulated gate field effect type, a gate and a drain of the third transistor being connected to a gate of the first transistor and a voltage source, a source of the third transistor being connected to the backgate bias generator to receive supply of the backgate bias voltage,
   wherein the second transistor has a threshold voltage substantially equal to a forward voltage of a parasitic diode between a semiconductor substrate and a drain of the first transistor.

3. An output signal circuit for use in a receiver, comprising:
   first and second transistors of an insulated gate field effect type, a source of the first transistor being capable of receiving an input signal, a source of the second transistor being capable of generating an output signal;
   a backgate bias generator to produce a backgate bias voltage which is applied to backgates of the first and second transistors commonly; and
   a gate voltage generator including a third transistor of an insulated gate field effect type, a gate and a drain of the third transistor being connected to a gate of the first transistor and a voltage source, a source of the third transistor being connected to the backgate bias generator to receive supply of the backgate bias voltage,
   wherein the backgate bias voltage from the backgate bias voltage generator is a difference forward voltage of a parasitic diode between a semiconductor substrate and a drain of the first transistor and a minimum drain voltage of the first transistor, and the second transistor has a threshold voltage substantially equal to a forward voltage of a parasitic diode between the semiconductor substrate and the drain of the first transistor.

* * * * *